United States Patent
Val

(10) Patent No.: US 9,899,250 B2
(45) Date of Patent: Feb. 20, 2018

(54) METHOD OF COLLECTIVE FABRICATION OF 3D ELECTRONIC MODULES CONFIGURED TO OPERATE AT MORE THAN 1 GHZ

(71) Applicant: 3D PLUS, Buc (FR)

(72) Inventor: Christian Val, Saint Remy les Chevreuse (FR)

(73) Assignee: 3D PLUS, Buc (FR)

( * ) Notice: Subject to any disclaimer, the term of this patent is extended or adjusted under 35 U.S.C. 154(b) by 0 days.

(21) Appl. No.: 15/621,908

(22) Filed: Jun. 13, 2017

(65) Prior Publication Data

US 2017/0372935 A1 Dec. 28, 2017

(30) Foreign Application Priority Data

Jun. 22, 2016 (FR) ...................................... 16 55798

(51) Int. Cl.
*H01L 21/683* (2006.01)
*H01L 25/00* (2006.01)
(Continued)

(52) U.S. Cl.
CPC .......... *H01L 21/6835* (2013.01); *H01L 24/24* (2013.01); *H01L 24/82* (2013.01);
(Continued)

(58) Field of Classification Search
CPC . H01L 23/3114; H01L 2023/405; H01L 24/01
See application file for complete search history.

(56) References Cited

U.S. PATENT DOCUMENTS 6,025,650 A * 2/2000 Tsuji ..................... H01L 21/565
257/668
2003/0178716 A1 9/2003 Maeda et al.
2009/0209052 A1 8/2009 Val

FOREIGN PATENT DOCUMENTS

FR 2 857 157 A1 1/2005
FR 2 905 198 A1 2/2008

\* cited by examiner

*Primary Examiner* — Mohammad Choudhry
(74) *Attorney, Agent, or Firm* — Baker & Hostetler LLP

(57) ABSTRACT

A method of collective fabrication of 3D electronic modules, each 3D electronic module comprising a stack of at least two, surface transferable, ball grid electronic packages, tested at their operating temperature and frequency comprises: a step of fabricating reconstituted wafers, each reconstituted wafer being fabricated according to the following sub-steps in the following order: A1)) the electronic packages are placed on a first sticky skin, balls side, B1) molding of the electronic packages in the resin and polymerization of the resin, to obtain the intermediate wafer, C1) thinning of the intermediate wafer on the face of the intermediate wafer opposite to the balls, D1) removal of the first sticky skin and placing of the intermediate wafer on a second sticky skin, side opposite to the balls, E1) thinning of the intermediate wafer on the balls side face, F1) formation of a balls side redistribution layer, G1) removal of the second sticky skin to obtain a reconstituted wafer of smaller thickness than the original thickness of the electronic packages, several reconstituted wafers having been obtained on completion of the previous sub-steps, stacking of the reconstituted wafers, dicing of the stacked reconstituted wafers to obtain 3D modules.

7 Claims, 4 Drawing Sheets

(51) Int. Cl.
*H01L 23/00* (2006.01)
*H05K 3/32* (2006.01)
(52) U.S. Cl.
CPC .............. *H01L 24/92* (2013.01); *H01L 25/50* (2013.01); *H05K 3/321* (2013.01); *H01L 2924/181* (2013.01)

METHOD OF COLLECTIVE FABRICATION OF 3D ELECTRONIC MODULES CONFIGURED TO OPERATE AT MORE THAN 1 GHZ

CROSS-REFERENCE TO RELATED APPLICATIONS

This application claims priority to foreign French patent application No. FR 1655798, filed on Jun. 22, 2016, the disclosure of which is incorporated by reference in its entirety.

FIELD OF THE INVENTION

The field of the invention is that of the collective fabrication of 3D electronic modules with reduced thickness comprising a stack of at least two electronic chips.

BACKGROUND

The arrival on the market of components operating at high frequency (memories, processors, etc.) means that the use of unencapsulated chips (bare chips) poses novel problems of efficiency. The testing of bare chips using probe tips becomes very tricky beyond frequencies of about 1 GHz. The prime consequence is that in the case where these components are stacked in a 3D electronic module, certain chips will be able to operate at the maximum frequency, others will not; it follows from this that a module comprising a plurality of chips will not be able to operate at the maximum frequency.

A means of circumventing this difficulty is to use encapsulated chips, that is to say ones placed in a package which can, itself, be fully tested. Indeed, a package comprises outputs in the form of solder balls which are at greater spacings than that of the pads of the chips:

Spacing of the pads of the chips: 50 to 100 µm,
Spacing of the ball grid packages encapsulating a chip: from 400 to 800 µm.

Test sockets can therefore be used and the packages are thus testable at frequencies of possibly greater than 1 GHz, as well as at operating temperatures lying between −55° C. and +125° C.

But a stack of packages is thicker than a stack of chips, and therefore leads to a likewise thicker 3D module whereas it is desired to obtain a 3D module with reduced thickness.

Starting from this observation, it is then necessary to find a stacking technology suitable for these packages able to operate at high frequency, and making it possible to obtain 3D modules with reduced thickness.

Consequently, there remains to this day a need for a method of collective fabrication of 3D electronic modules which is simultaneously satisfactory in respect of all the aforementioned requirements, in terms of reliability of the electronic chips at operating frequencies in particular greater than 1 GHz, at operating temperatures lying between −55° C. and +125° C. and of reduced thickness of the 3D modules obtained.

More precisely the subject of the invention is a method of collective fabrication of 3D electronic modules, each 3D electronic module comprising a stack of at least two, surface transferable, ball grid electronic packages, tested at their operating temperature and frequency, which comprises:

a step of fabricating reconstituted wafers, each reconstituted wafer being fabricated according to a first embodiment according to the following sub-steps in the following order:

A1) the electronic packages are placed on a first sticky skin, balls side,
B1) molding of the electronic packages in the resin and polymerization of the resin, to obtain the intermediate wafer,
C1) thinning of the intermediate wafer on the face of the intermediate wafer opposite to the balls,
D1) removal of the first sticky skin and placing of the intermediate wafer on a second sticky skin, side opposite to the balls,
E1) thinning of the intermediate wafer on the balls side face,
F1) formation of a balls side redistribution layer,
G1) removal of the second sticky skin to obtain a reconstituted wafer of smaller thickness than the original thickness of the electronic packages, several reconstituted wafers having been obtained on completion of the previous sub-steps, stacking of the reconstituted wafers, dicing of the stacked reconstituted wafers to obtain 3D modules.

SUMMARY OF THE INVENTION

The subject of the invention is also a method of collective fabrication of 3D electronic modules, each 3D electronic module comprising a stack of at least two, surface transferable, ball grid electronic packages, tested at their operating temperature and frequency, which comprises:

a step of fabricating reconstituted wafers, each reconstituted wafer being fabricated according to a second embodiment according to the following sub-steps in the following order:

A2) the electronic packages are placed on a first sticky skin on the side opposite to the balls,
B2) molding of the electronic packages in the resin and polymerization of the resin, to obtain the intermediate wafer,
C2) thinning of the intermediate wafer on the face of the intermediate wafer, balls side,
D2) formation of a balls side redistribution layer,
E2) removal of the first sticky skin and placing of the thinned intermediate wafer on a second sticky skin, RDL side,
F2) thinning of the intermediate wafer on the face of the intermediate wafer opposite to the balls,
G2) removal of the second sticky skin to obtain a reconstituted wafer of smaller thickness than the original thickness of the electronic packages, several reconstituted wafers having been obtained on completion of the previous sub-steps, stacking of the reconstituted wafers, dicing of the stacked reconstituted wafers to obtain 3D modules.

There are therefore two thinning steps.

The electronic packages are BGA packages or flip-chip packages; the BGA electronic packages can comprise central projections.

The operating frequency is in particular greater than 1 GHz, and/or the operating temperature lies for example between −55° C. and 125° C.

The step of thinning the intermediate wafer on the face of the intermediate wafer, balls side, can be replaced with a step of removing the balls of said electronic packages prior to the step of placing the electronic packages on the first sticky skin.

BRIEF DESCRIPTION OF THE DRAWINGS

Other characteristics and advantages of the invention will become apparent on reading the detailed description which follows, given by way of nonlimiting example and with reference to the appended drawings in which.

Across the figures, the same elements are labeled by the same references.

DETAILED DESCRIPTION

In the subsequent description, the expressions "upper", "lower", "front", "rear", "side", are used with reference to the orientation of the figures described. Insofar as the device can be positioned according to other orientations, the directional terminology is indicated by way of illustration and is not limiting.

The electrical testing of bare chips may not guarantee reliable operation at frequencies above 1 Ghz. On the other hand, the testing of electronic packages, that is to say of electronic components having connection balls, which are surface transferable and include chips, can be applied at these frequencies above 1 GHz and also guarantees an operating temperature of between −55° C. and +125° C.

The invention is based on the fabrication of a wafer which is reconstituted not with bare chips but with electronic packages. Once the wafers have been reconstituted with N "good" BGA packages, (N possibly reaching several hundred), their stacking, dicing etc. will be done for example as already described in patents FR 03 07977 and FR 06 07442.

Figure 1A:
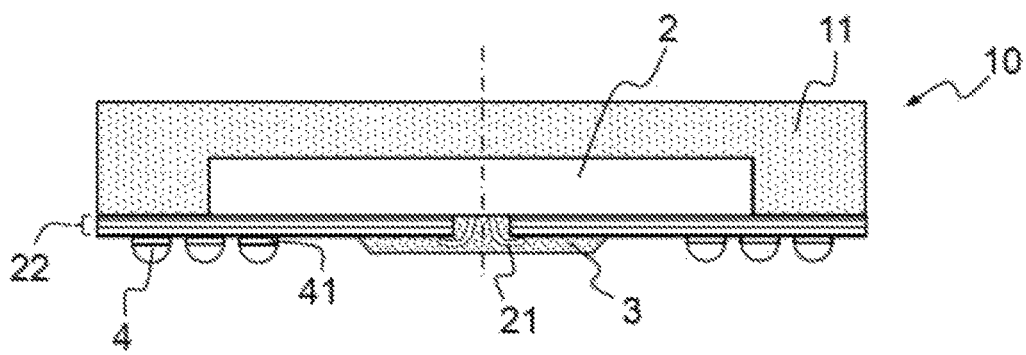
FIGS. 1a-1c schematically represent examples of electronic packages of BGA type with thickening (FIG. 1a), without thickening (FIG. 1b), of Flip-Chip type (FIG. 1c), viewed in section.
Figure 1B:
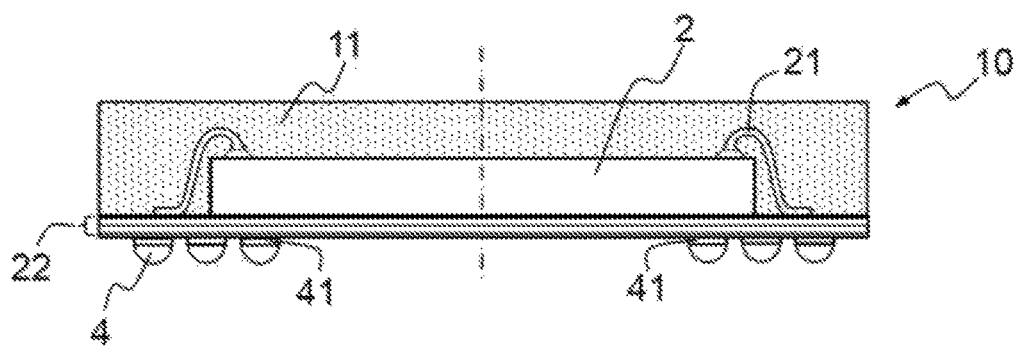
Figure 1C:
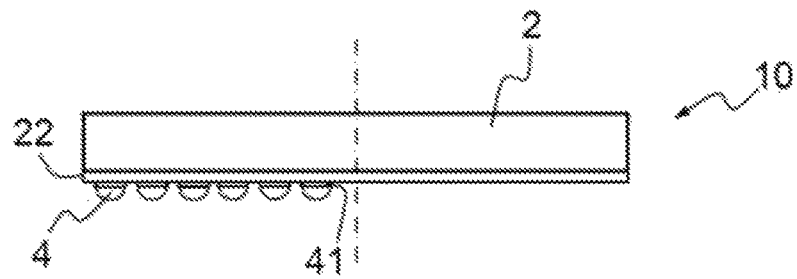

Electronic package 10, some examples of which are shown in FIGS. 1a-1c, refers to:

a (BGA or Ball Grid Array) ball grid package 10 having connection balls 4 (or solder balls), that is to say a bare chip 2 encapsulated in resin 11, this bare chip 2 exhibiting connection wires 21 linked to an interconnection circuit 22 (generally having several layers) furnished with said balls 4. These wires embedded in the resin are linked to the upper face of the circuit (FIG. 1b), or these wires are linked to the face below the circuit and also protected by resin, thereby forming a protruding central thickening 3 (or central projection) under the package (FIG. 1a).

The connection balls 4 of these packages have a thickness $e_b$ typically being between 200 µm and 400 µm; the thickening 3, inherent in memory packages, at the center of the package is typically about 150 µm; the thickness $e_c$ of the body of the package (that is to say the package without the connection balls) is typically between 0.8 mm and 0.9 mm; the total thickness E of a package ($E=e_b+e_c$) therefore being between 0.82 mm and 1.3 mm.

A flip-chip component 10, that is to say an unencapsulated chip 2 linked to an interconnection layer 22 termed the redistribution layer, furnished with connection balls 4 (FIG. 1c). This type of Flip-Chip component is considered according to the invention to be a package 10, since it:

can be transferred onto a substrate like ball grid packages (BGA), tested before delivery to the customer, since the spacing of the balls (from 100 to 500 µm) is much higher than that of the pads of the chips (from 40 to 100 µm), and enables the component to be tested using test sockets and therefore at frequencies possibly above 1 GHz.

Moreover, it is easier to have such Flip-Chip packages than bare chips, and they are less bulky than BGA packages. These Flip-Chip packages do not exhibit any thickening as indicated for certain BGA packages.

The connection balls 4 of these Flip-Chip packages have a thickness $e_b$ of typically between 50 µm and 150 µm; the thickness $e_c$ of the body of the Flip-Chip package (that is to say the package without the connection balls) is typically between 100 µm and 400 µm. The total thickness E of a package ($E=e_b+e_c$) therefore being between 150 µm and 550 µm.

The pads 41 and the circuit or the interconnection layer 22 are no longer represented in the following figures for simplicity.

Such tested packages 10 are marketed by various manufacturers among which may be cited: Xilinx, Micron, Samsung, etc.

According to the invention, 3D electronic modules comprising a stack of at least two, surface transferable, ball grid electronic packages 10, tested at their operating temperature and frequency are fabricated collectively in the following manner:

fabrication of several reconstituted wafers, each reconstituted wafer 60 comprising only N "good" packages, that is to say only tested packages, stacking of the reconstituted wafers, dicing of the stacked reconstituted wafers to obtain 3D modules.

The progression of the steps of fabricating a reconstituted wafer varies depending on whether the electronic packages are placed on a first sticky skin, connection balls side or opposite side. The same steps are employed but carried out in a different order.

Figure 2:
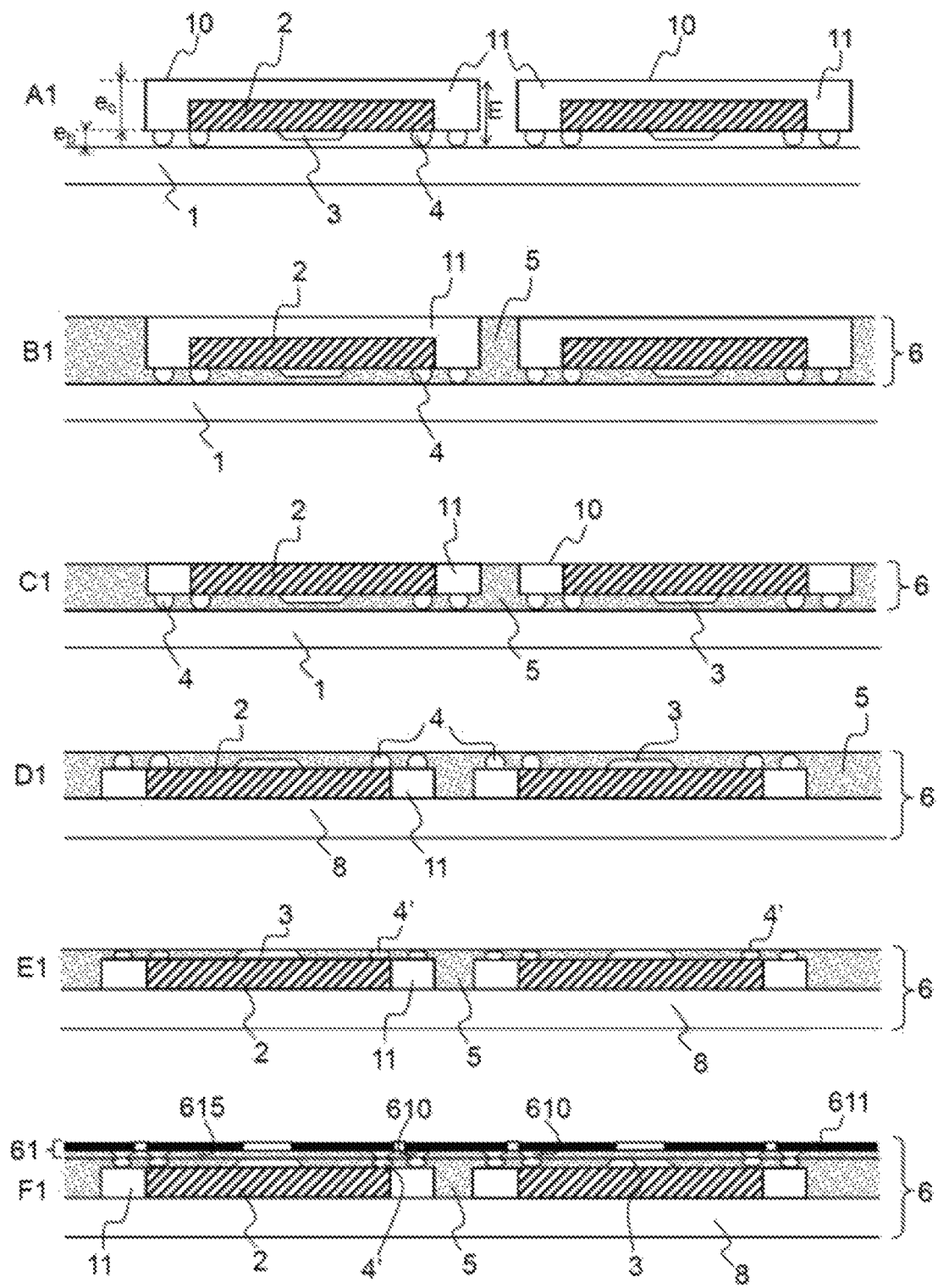
FIG. 2 illustrates various steps of an exemplary method according to the invention.

The progression of the steps when the packages 10 are placed connection balls side is described in conjunction with FIG. 2.

Step A1: The N packages 10 are placed on a first sticky skin 1 also called "tape" in English, on the side of the connection balls 4 by means of a Pick and Place facility. But there is no step of soldering the connection balls; the balls 4 are simply provisionally fixed to this adhesive 1. These N packages are all the same.

Step B1: Molding of the packages 10 in resin 5 for example by compression or by casting. Next, polymerization of the resin. An intermediate wafer 6 has then been obtained.

Step C1: Thinning of this intermediate wafer on the side of its rear face (=face opposite to the balls). The thinning of the rear faces of the packages 10 makes it possible to reach the rear faces of the chips 2 situated inside the packages 10: the thinning can be limited to the appearance of the rear faces of the chips 2 or can go as far as to thin the chips 2 themselves. The thickness $e_c$ of the body of the package 10 can be reduced by about 30% to 35%.

Step D1: removal of the first sticky skin 1 and placing of the intermediate wafer thus thinned on a second sticky skin 8 side opposite to the solder balls 4 of the packages (the side thinned in step C1 is stuck to the sticky skin 8).

Step E1: a second thinning is performed so as to reduce the thickness $e_b$ of the solder balls 4. The balls are for example composed of tin/silver/copper (Sn/Ag/Cu, also dubbed SAC). Thinned balls 4' are obtained.

Step F1: Formation of a redistribution layer 61 (also referred to as the RDL layer, the acronym standing for the expression ReDistribution Layer) thinned balls 4' side. This RDL layer formed from a photoetchable resin 615, comprises electrical contacts 610 with the balls 4' and one or more sub-layers comprising electrical conductors 611 linking the contacts 610 up to the periphery of the package (=up to the dicing paths 70). Indeed when the stacking of the wafers 60 will be performed, vertical (along the direction of the stack) conductors linked to the conductors 611 sections present on the periphery, will be produced on vertical faces of the 3D modules. This RDL layer 61 is made by conventional depositions: photoetchable dielectric and metallic depositions using a diffusion barrier of the type Titanium/Tungsten and then copper.

Step G1: Removal of the second sticky skin 8 to obtain a reconstituted wafer 60.

Figure 3:
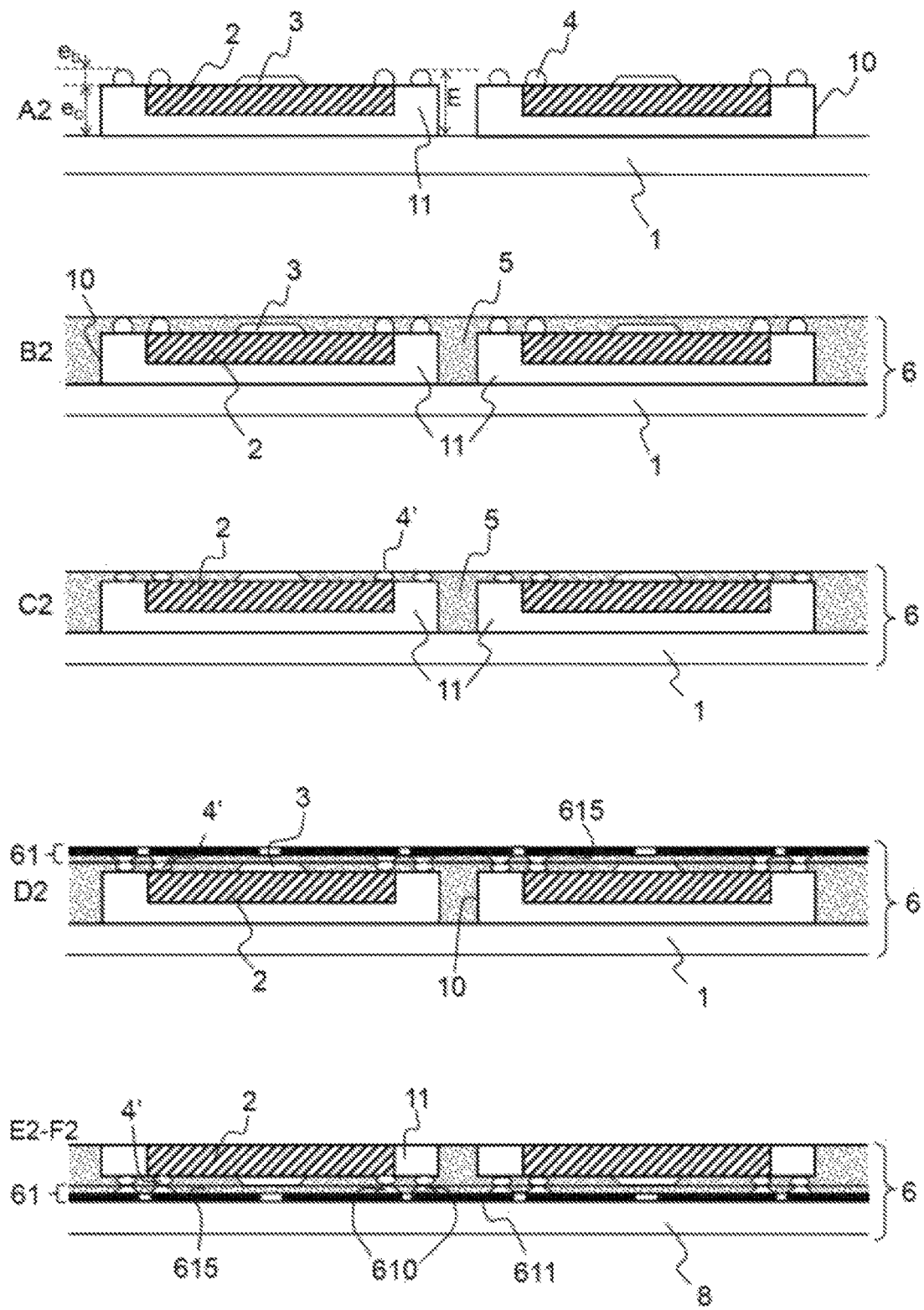
FIG. 3 illustrates various steps of another exemplary method according to the invention, FIG. 4 schematically represents an exemplary reconstituted wafer obtained by the method according to the invention, viewed in section, FIG. 5 schematically represents an exemplary stack of 4 reconstituted wafers obtained by the method according to the invention, viewed in section.

The progression of the steps when the packages 10 are placed side opposite to the connection balls 4 is now described in conjunction with FIG. 3.

Step A2: The packages 10 are stuck on a first sticky skin 1 on the side not carrying the balls 4. The head of the Pick and Place facility used must be suitable for grasping packages not having a continuous plane surface as in the previous case. The suction head of this facility is hollowed out so as to avoid the balls 4 and the possible central thickening 3 of the packages 10.

Step B2: Molding of the packages in resin 5 for example by compression or casting, as far as the plane of the balls 4 or slightly above the plane of the balls. The packages 10 being transferred onto the first sticky skin on the side opposite to the balls, there is no problem as possibly in step B1 of FIG. 2 with the filling of the resin in the space between the surface of the balls and the first sticky skin. Next, polymerization of the resin. The intermediate wafer 6 has been obtained.

Step C2: Thinning, applied to the face comprising the balls 4, of the intermediate wafer 6 so as to reduce the volume of the balls and above all their thickness. Thinned balls 4' are obtained.

Step D2: The interconnection of the thinned balls 4' with the future vertical conductors is performed as in step F1 by a redistribution layer 61 (RDL) which comprises electrical contacts 610 with the balls 4' and one or two redistribution sub-layers.

Step E2: The thinned intermediate wafer 6 supplemented with the RDL layer, is unstuck from the first sticky skin 1, and then turned over and stuck on a second sticky skin 8 RDL layer side.

Step F2: A thinning is then performed on face opposite to the RDL layer, as indicated in step C1.

Step G2: Removal of the second sticky skin 8 to obtain a reconstituted wafer 60.

On completion of these steps, a reconstituted wafer of small thickness has therefore been obtained, comprising only "good" packages (N packages), that is to say only tested packages, and which is intended to be stacked on other wafers reconstituted in the same manner.

The two ways of progressing the steps of fabricating a reconstituted wafer 60 such as were described previously can be used for a BGA package 10 with or without central thickening 3 or a package 10 of Flip-chip type. In the case of a BGA package without thickening 3 or a package of Flip-chip type, the step of thinning the faces on the side of the balls is not limited by the central projection (steps E1 or C2) and the thinning can approach to about 50 µm of the surface of the body of the package. In the case of a BGA package without thickening or of a package of Flip-chip type, this enables the total thickness of the final package to be reduced slightly more by about 100 µm more.

Before the transferal of the packages 10 onto the sticky skin 1 of steps A1) or A2), it is possible to deball (=remove the balls 4) the tested packages 10 which have no central projections 3. This deballing is performed collectively after the acquisition of the tested packages; it is performed mechanically for example or by plasma gas phase chemical attack. Under these conditions, the surface of the package which carried the balls comprises only the pads 41 (visible in FIGS. 1a-1c) with or without a residue of balls 4. Step E1 or C2 of thinning the balls becomes superfluous. The RDL 61 is produced so as to connect not the balls 4' but directly the pads 41 just as for the steps already described: step F1 or D2. The advantage of this approach is in particular a slightly smaller thickness of the package (body+balls).

The table hereinbelow summarizes the thicknesses obtained in the course of these steps for a BGA or Flip-Chip package 10.

|  | BGA package 10 | Flip-Chip package 10 |
| --- | --- | --- |
| Spacing of the balls 4 | 400 to 800 µm | 100 to 400 µm |
| Thickness of the balls 4 before thinning | 200 to 400 µm | 50 to 150 µm |
| Thickness of the balls 4' after thinning for a package 10 with central thickening 3 | 150 to 200 µm |  |
| Thickness of the balls 4' after thinning for a package 10 without central thickening 3 | 50 to 100 µm | 25 to 75 µm |
| Thickness of the balls 4 after deballing | 0 to 10 µm | 0 to 10 µm |
| Thickness of the body of the package 10 before thinning | 800 to 900 µm | 100 to 400 µm |
| Thickness of the body of the package 10 after thinning | 520 to 630 µm | 65 to 280 µm |
| Total thickness of the package 10 before thinnings (=when purchased) | 1 to 1.3 mm | 150 to 650 µm |
| Total thickness of the package 10 after thinnings | 670 to 830 µm | 90 to 355 µm |

The thicknesses indicated for the balls 4 or 4' include that of the pads 41.

The thickness of the reconstituted wafer 60 (=thickness of the packages and of the RDL) is therefore:

between 700 µm and 860 µm for a wafer 60 with BGA packages 10, between 95 µm and 360 µm for a wafer 60 with Flip-Chip packages 10.

Figure 4:
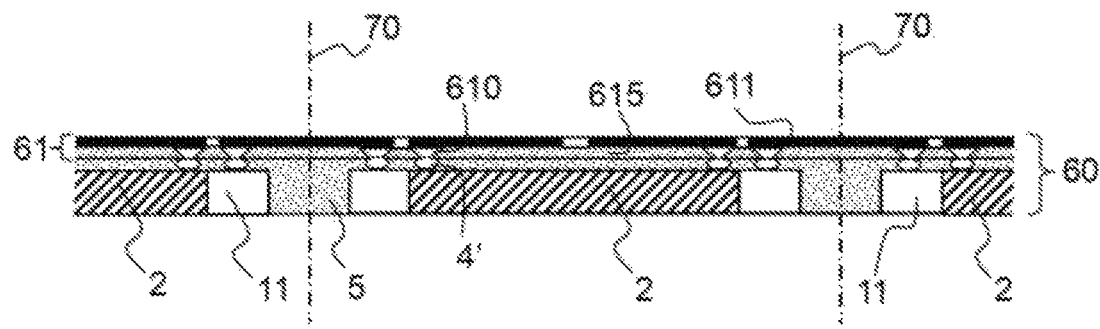
Figure 5:
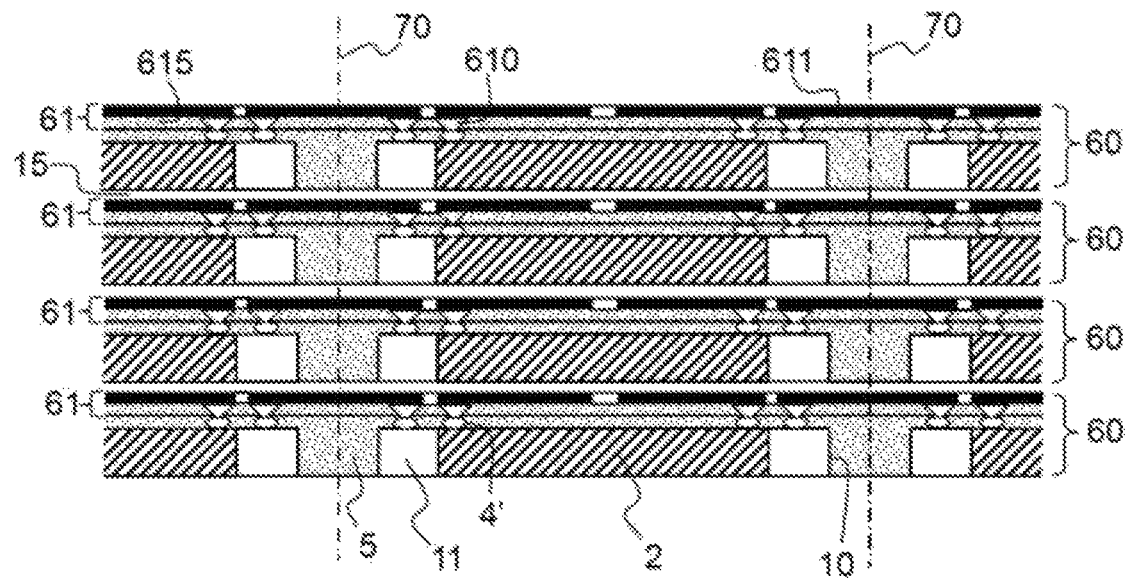

A reconstituted wafer 60 obtained by one or the other method and on which dicing paths 70 are indicated is shown in FIG. 4. These reconstituted wafers 60 are then stacked one above the other while aligning the dicing paths 70, and stuck by means of a glue 15 as may be seen in FIG. 5. Next, the stack is diced along the dicing paths so as to obtain N 3D electronic modules which will be supplemented in particular with vertical buses formed on vertical faces of the 3D modules.

The invention claimed is:

1. A method of collective fabrication of 3D electronic modules, each 3D electronic module comprising a stack of at least two, surface transferable, ball grid electronic packages, tested at their operating temperature and frequency, which comprises:
   a step of fabricating reconstituted wafers, each reconstituted wafer being fabricated according to the following sub-steps in the following order:
      A1) the electronic packages are placed on a first sticky skin balls side,
      B1) molding of the electronic packages in the resin and polymerization of the resin, to obtain the intermediate wafer,
      C1) thinning of the intermediate wafer on the face of the intermediate wafer opposite to the balls,
      D1) removal of the first sticky skin and placing of the intermediate wafer on a second sticky skin, side opposite to the balls,
      E1) thinning of the intermediate wafer on the balls side face,
      F1) formation of a balls side redistribution layer,
      G1) removal of the second sticky skin to obtain a reconstituted wafer of smaller thickness than the original thickness of the electronic packages,
   several reconstituted wafers having been obtained on completion of the previous sub-steps, stacking of the reconstituted wafers,
   dicing of the stacked reconstituted wafers to obtain 3D modules.

2. A method of collective fabrication of 3D electronic modules, each 3D electronic module comprising a stack of at least two, surface transferable, ball grid electronic packages, tested at their operating temperature and frequency, which comprises:
   a step of fabricating reconstituted wafers, each reconstituted wafer being fabricated according to the following sub-steps in the following order:
      A2) the electronic packages are placed on a first sticky skin side opposite to the balls,
      B2) molding of the electronic packages in the resin and polymerization of the resin, to obtain the intermediate wafer,
      C2) thinning of the intermediate wafer on the face of the intermediate wafer, balls side,
      D2) formation of a balls side redistribution layer,
      E2) removal of the first sticky skin and placing of the thinned intermediate wafer on a second sticky skin RDL side,
      F2) thinning of the intermediate wafer on the face of the intermediate wafer opposite to the balls,
      G2) removal of the second sticky skin to obtain a reconstituted wafer of smaller thickness than the original thickness of the electronic packages,
   several reconstituted wafers having been obtained on completion of the previous sub-steps, stacking of the reconstituted wafers,
   dicing of the stacked reconstituted wafers to obtain 3D modules.

3. The method of collective fabrication of 3D electronic modules according to claim 1, wherein the electronic packages are BGA packages or flip-chip packages.

4. The method of collective fabrication of 3D electronic modules according to claim 1, wherein the operating frequency is greater than 1 GHz.

5. The method of collective fabrication of 3D electronic modules according to claim 1, wherein the operating temperature lies between −55° C. and 125° C.

6. The method of collective fabrication of 3D electronic modules according to claim 1, wherein electronic packages comprise central projections.

7. The method of collective fabrication of 3D electronic modules according to claim 1, wherein the step of thinning the intermediate wafer on the face of the intermediate wafer, balls side, is replaced with a step of removing the balls of said electronic packages prior to the step of placing the electronic packages on the first sticky skin.

* * * * *